United States Patent
Zavadsky et al.

(10) Patent No.: US 7,207,018 B2
(45) Date of Patent: Apr. 17, 2007

(54) METHOD AND APPARATUS FOR LOCATING SHORT CIRCUIT FAULTS IN AN INTEGRATED CIRCUIT LAYOUT

(75) Inventors: Vyacheslav L. Zavadsky, Ottawa (CA); Elmehdi Aitnouri, Nepean (CA); Edward Keyes, Ottawa (CA); Jason Abt, Kanata (CA); Val Gont, Kanata (CA); Stephen Begg, Ottawa (CA)

(73) Assignee: Semiconductor Insights Inc., Ontario (CA)

( * ) Notice: Subject to any disclaimer, the term of this patent is extended or adjusted under 35 U.S.C. 154(b) by 346 days.

(21) Appl. No.: 10/910,624

(22) Filed: Aug. 4, 2004

(65) Prior Publication Data

US 2006/0031792 A1 Feb. 9, 2006

(51) Int. Cl.
*G06F 17/50* (2006.01)
(52) U.S. Cl. .................... 716/5; 716/4; 716/7
(58) Field of Classification Search .......... 716/4, 716/5, 2, 7
See application file for complete search history.

(56) References Cited

U.S. PATENT DOCUMENTS

| | | | |
|---|---|---|---|
| 5,617,021 A | 4/1997 | Goetting et al. | 324/538 |
| 5,949,986 A | 9/1999 | Riley et al. | 716/2 |
| 6,578,175 B1 | 6/2003 | Benevit et al. | 716/2 |
| 6,694,495 B1 | 2/2004 | Hussain et al. | 716/4 |

OTHER PUBLICATIONS

Cormen et al., "Introduction to Algorithms," 2nd Edition, Chapter 26, McGraw-Hill Book Company, 2001.

*Primary Examiner*—Sun James Lin
(74) *Attorney, Agent, or Firm*—Price, Heneveld, Cooper, DeWitt & Litton, LLP

(57) ABSTRACT

The method and apparatus in accordance with the present invention determines the locations of incorrectly connected polygons in a polygon representation of an integrated circuit layout. These incorrectly connected polygons result in short circuits, which often occur for major signal busses such as power and ground. It can be time-consuming to determine the exact location of the short. The invention includes the step of tessellating the polygon representation, including each conductive layer, into predetermined shapes such as triangles or trapezoids. Each of the triangles or trapezoids is then translated into a node for the development of a nodal network where nodes are connected directly to one another to represent shapes having edges adjacent to other shape edges. The current capacity of each connection between adjacent nodes is then specified. Two nodes that are electrically connected to the incorrectly connected polygons are selected and used as parameters for a network flow analysis algorithm. This algorithm determines the areas of high density where high flow is dictated by the triangle or trapezoid having the lowest current capacity. The areas of high density are flagged as points where short circuits may exist. These flagged points may then be investigated to confirm whether they are short circuits.

16 Claims, 11 Drawing Sheets

METHOD AND APPARATUS FOR LOCATING SHORT CIRCUIT FAULTS IN AN INTEGRATED CIRCUIT LAYOUT

BACKGROUND OF THE INVENTION

1. Field of the Invention

The present invention relates generally to a method and apparatus for locating short circuit faults in an integrated circuit layout, and more particularly to locating faults due to incorrectly connected nets in IC layouts such as in extracted or reverse engineered integrated circuit layouts.

2. Related Art

During fabrication of an integrated circuit (IC), a layout corresponding to the physical characteristics of the IC is designed and used as a mask set. This mask set is then overlaid on a wafer of silicon. The IC layout comprises a series of nets representing the arrangement of the various conductive layers. A net is defined as a continuous path of electrically conductive wiring within an electrical wire network, this is normally represented in layout as sets of electrically connected polygons.

A similar layout is created during reverse engineering of an IC. This layout also comprises a series of polygons representing the arrangement of the various conductive layers. Unlike the previous case, however, this layout is used to extract the electrical conductive circuitry that make up the IC.

Incorrect placement of polygons or contact materials connecting adjacent conductive layers (vias), results in the connection of one net to another on the layout. Dirt or debris on a de-layered IC can cause incorrect layout extraction if the software processes the dirt or debris as conductive wiring connecting two or more existing nets. Further a software layout tool placing nets on an IC may erroneously connect two nets together. This results in a malfunctioning IC or an incorrect circuit extraction.

If only geometric information is available to the programs analyzing the layout information, then it is typically not possible to precisely locate the position of the incorrectly placed polygon(s).

U.S. Pat. No. 5,949,986, which issued to Riley et al on Sep. 7, 1999, teaches a way to extract signal connectivity information from the layout. It allows, during the verification phase, the ability to locate circuits that are shorted because of error. It does not, however, provide an efficient way to locate actual point(s) where the error is made. If major signals are shorted, for example POWER and GROUND buses, the manual inspection to find the error is very time consuming since these busses account for up to half of the total wiring capacity.

Other solutions involve a binary search of the layout. The layout is cut in half, and each half is investigated for the presence of shorts between signals. The process continues until the short is located. However, this algorithm involves serious manual interaction, and is applicable only for locating a short that occurs in a single point.

Therefore there is a need for a new solution that can precisely locate short circuits in an IC layout without spending a lot of processing time.

SUMMARY OF THE INVENTION

The present invention is directed to a method and apparatus for determining the locations of incorrectly connected polygons in a polygon representation of an integrated circuit having at least one conductive layer. The invention comprises tessellating the polygon representation of each conductive layer into predetermined shapes. The shapes are translated into nodes, which are used to develop a node network where nodes are connected directly to one another as a representation of shapes having adjacent edges. Further, current capacities between connected nodes are identified. The invention further includes selecting at least two nodes that are electrically connected to the incorrectly connected polygons, and running a network flow analysis algorithm based on the current capacities to determine areas of high current density between the two nodes. The points of high current density can be used to further investigate whether connections between polygons are shorts.

In accordance with a further aspect of this invention, the invention includes determining a ratio of the total used current capacity of each edge relative to the current capacity of the edge for adjacent nodes, and running the network flow analysis algorithm based on the ratios.

In accordance with another aspect of this invention, the polygon representation includes one or more vias connecting adjacent conductive layers.

In accordance with a further aspect of this invention, the network flow analysis algorithm is a Ford-Fulkerson algorithm.

In accordance with a specific aspect of this invention, the predetermined shapes comprise triangles or trapezoids.

The network flow analysis algorithm flags these areas of high current density and these areas are regarded as suspicious points. These points can then be investigated to determine if short circuits exist.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein:

FIG. 8b shows the application of multiple start and finish point to FIG. 8a

DETAILED DESCRIPTION

Figure 1A:
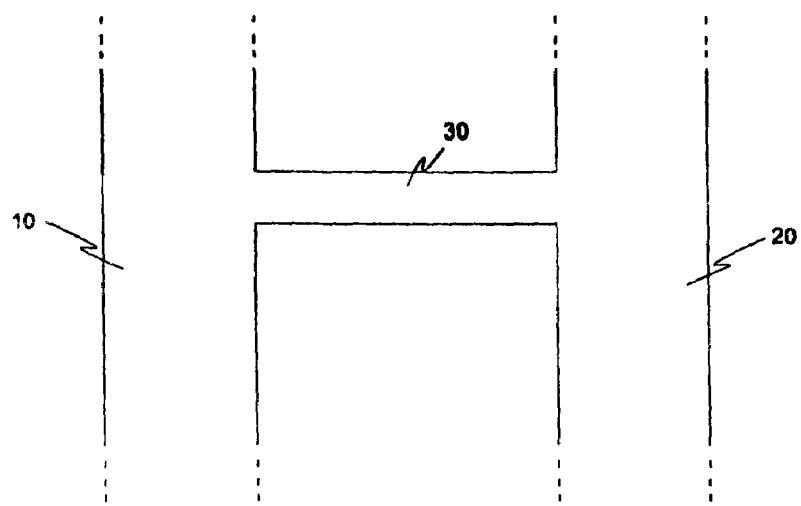
FIG. 1a shows an example of a power and ground bus shorted together by a polygon.

FIG. 1a shows a common example of a short circuit between two nets. A ground bus or net 10 runs parallel to a power bus or net 20. The ground bus 10 lies on the same conductive layer as the power bus 20. Due to either an incorrect bus placement or an error in layout extraction, a conductor 30, lying on the same conductive layer as the ground bus 10 and the power bus 20, is seen connecting the aforementioned busses 10, 20 and the busses are then considered to be part of the same net. If not detected early, the conductor 30 could lead to a malfunctioning IC or an erroneous circuit extraction.

Figure 1B:
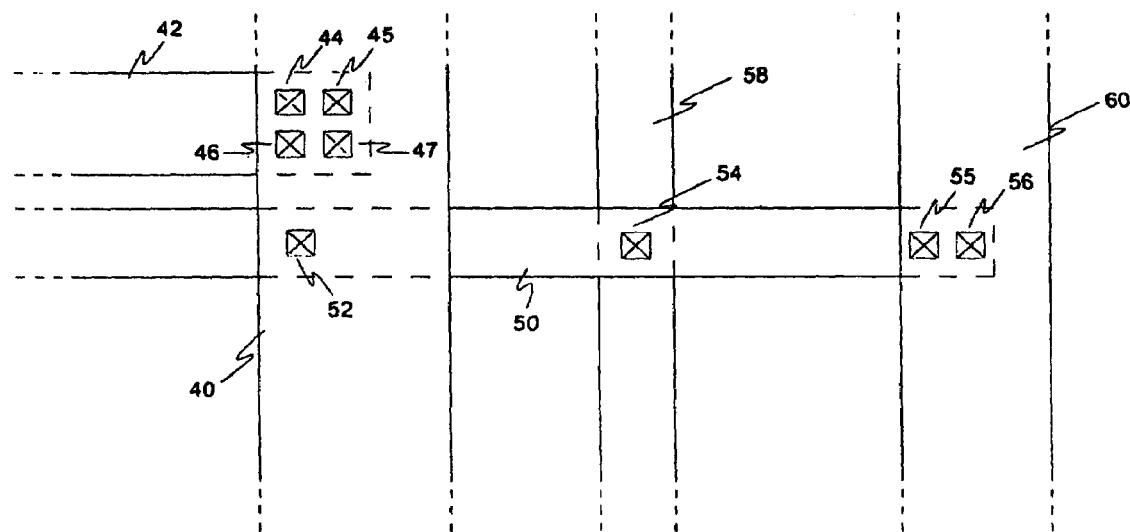
FIG. 1b shows an example of a bus shorted to another net by a via.

FIG. 1b shows a more involved example of a short circuit between two nets. A first signal bus 40 runs perpendicular to a first net 50. The first signal bus 40 is on an adjacent conductive layer to the first net 50. The first signal bus 40 is connected to a second signal bus 42 through a set of four vias: first via 44, second via 45, third via 46 and fourth via 47. First net 50 is connected to a second net 58 through a fifth via 54 and to a third signal bus 60 through a sixth and seventh vias 55, 56. Due to either an incorrect via placement or an error in layout extraction, an eighth via 52 falsely connects first signal bus 40 with first net 50. As a result, the first signal bus 40, the first net 50 and the first via 52 are considered to be part of the same net.

The present invention for locating short circuits involves measurement of the current flow using the current capacity of the various parts of a net. The idea is that the current flow capacity of incorrectly placed nets or vias should be substantially lower than the current flow capacity of the actual circuitry. In the case of FIG. 1a, the current flow capacity of the net 30 is much smaller than the current flow capacity of either the ground bus 10 or the power bus 20. In the case of FIG. 1b, the current capacity of the via 52 is much smaller than the current capacity of the bus 40.

To determine the location of the short circuit based on a measure of the current density, a network flow simulation approach is used. The areas of wiring which limit current flow are identified and these points are marked as suspicious.

Figure 2A:
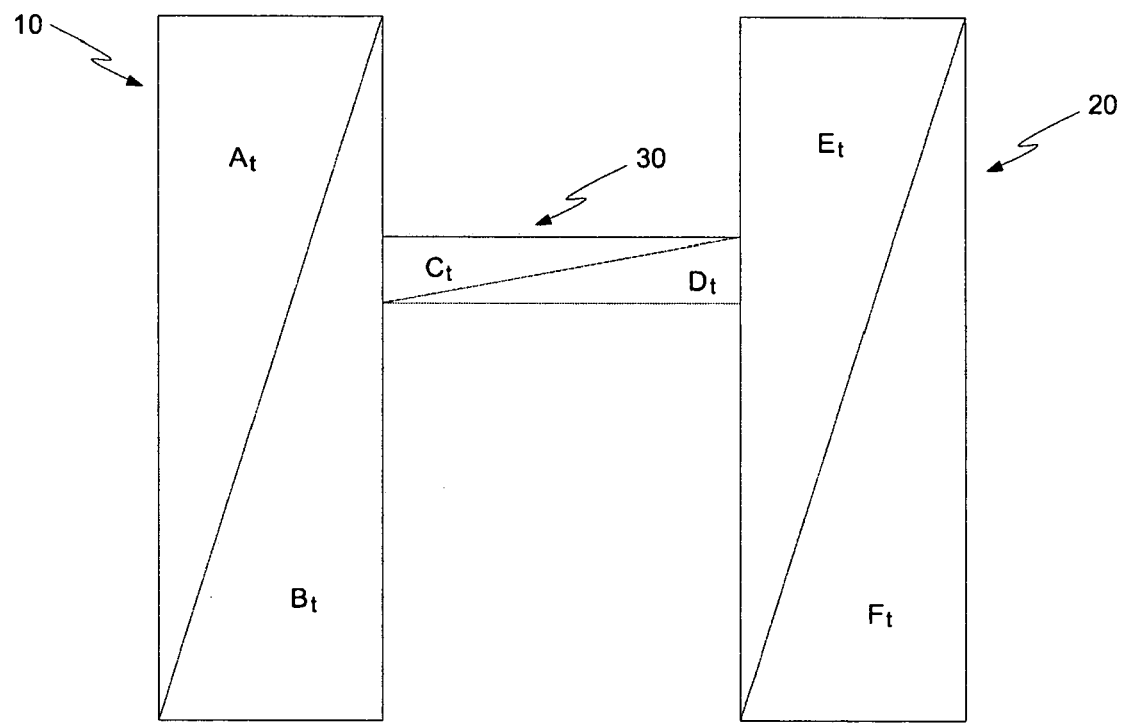
FIG. 2a shows the tessellation of FIG. 1a into triangles.

The first step of this approach is to tessellate each polygon representation of the conductive layers. FIG. 2a shows the triangulation of FIG. 1a. In this example there are six triangles. The ground bus 10 is divided into triangles At and Bt. The power bus 20 is divided into triangles Et and Ft. The erroneous polygon 30 is divided into triangles Ct and Dt.

Figure 2B:
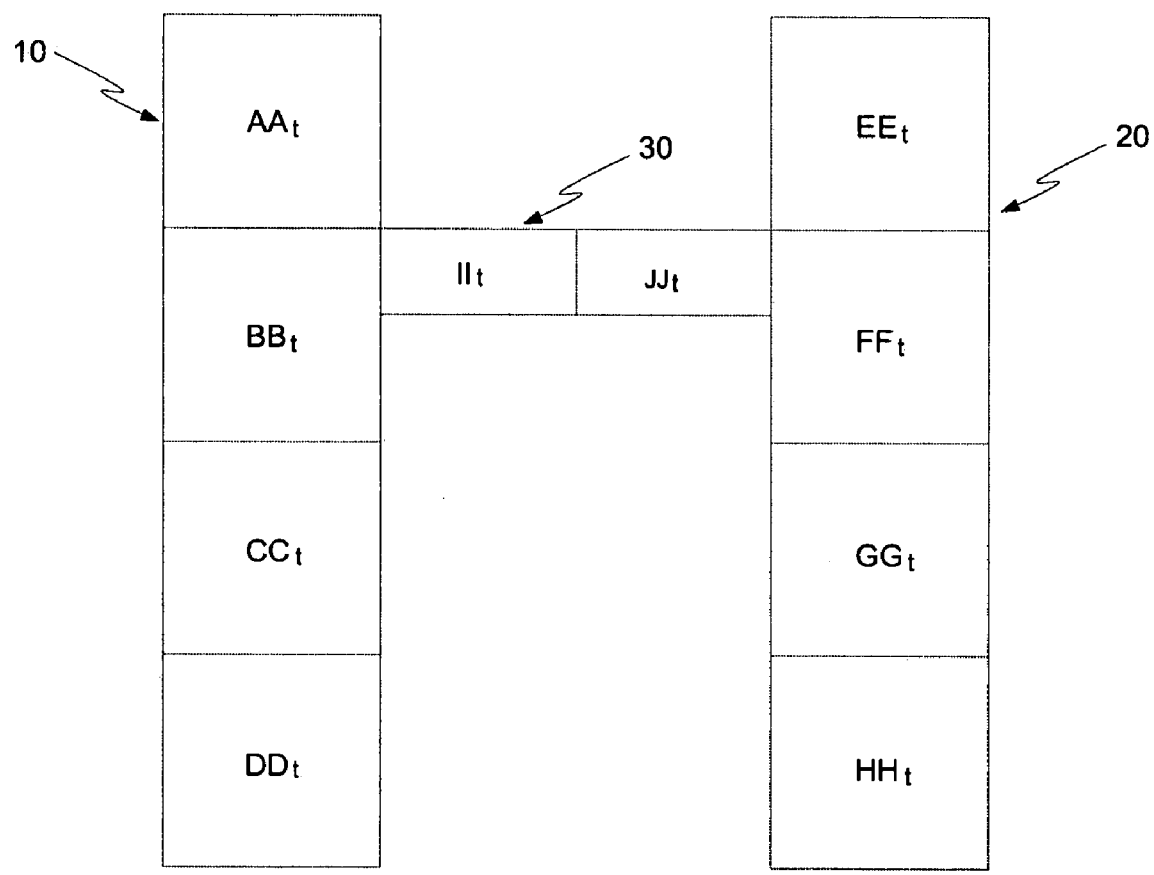
FIG. 2b shows the tesselation of FIG. 1a into trapezoids.

Alternately, each polygon representation of the conductive layers in FIG. 1a can be tessellated into trapezoids instead of triangles as shown in FIG. 2b. In this example, there are 10 trapezoids, the ground bus 10 is divided into trapezoids AAt, BBt, CCt and DDt; the power bus 20 is divided into trapezoids EEt, FFt, GGt and HHt; and the erroneous conductor 30 is divided into trapezoids IIt and JJt.

Figure 3:
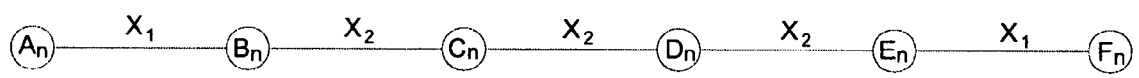
FIG. 3 shows the node network corresponding to the tessellated network of FIG. 2.

The next step is to develop a node network where each triangle represents a node. FIG. 3 shows the node network of FIG. 2a. The same approach can be used to develop a node network where each trapezoid in FIG. 2b represents a node.

The connection of the nodes is arranged according to the triangles of FIG. 2a. Triangle Bt has adjacent edges to triangles At and Ct, therefore node Bn is connected between nodes An and Cn. Triangle Dt has adjacent edges to triangles Ct and Et, therefore node Dn is connected between nodes Cn and En. Triangles At and Ft in this example are only connected to triangles Bt and Et respectively. A measure of the current capacity between adjacent triangle edges is identified between adjacent connected nodes in FIG. 3. The measure used for the present invention is the minimum width of the bus or net in the area of connection. The current capacity of any wire, net or bus is proportional to its width. For example, assuming ground bus 10 has a width of x1, the current capacity between nodes An and Bn is given by x1. If it is also assumed that the power bus 20 has a width x1, then the current capacity between nodes En and Fn is also x1. Since the width of the erroneous conductor 30 is less than either the ground bus 10 or the power bus 20, its width is given by x2 where x1>x2. The current capacity therefore between nodes Cn and Dn is x2. The maximum current capacity between nodes Bn and Cn is given by the minimum current capacity of the ground bus 10 and the erroneous conductor 30. The erroneous conductor 30 simply cannot support the current levels that the ground bus 10 can due to its smaller width. As a result, the current capacity between nodes Bn and Cn is given by x2. The current capacity between nodes Dn and En is also given by x2. The result is that the current capacity for the entire net 10, 20, 30 is restricted to x2

Figure 4:
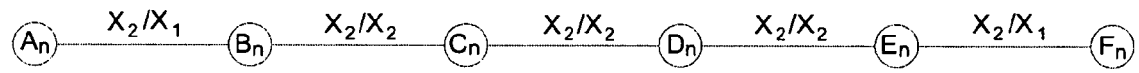
FIG. 4 shows the same node network of FIG. 3 showing the total used current capacity of each edge versus the current capacity of each edge.

An s-t maximum flow/minimum cut algorithm known in the art, such as the Ford-Fulkerson algorithm, is run on the node network of FIG. 3 to determine a minimum cut between nodes An and Fn. The Ford-Fulkerson algorithm is described in the textbook by Cormen et al "Introduction to Algorithms", 2nd edition, chapter 26, McGraw-Hill Book Company, 2001, which is incorporated herein by reference. The outputs of this algorithm include: a determination of maximum flow, set of edges that form a minimum cut and the used current capacity of each edge. The minimum cut is defined as the minimum sum of subsets of edges that separate two given nodes, in this case nodes An and Fn. The node networks of FIGS. 3 and 4 show that the erroneous conductor 30 will have much smaller edge widths, which are proportional to their current capacity. This algorithm examines all the possible flow paths from two known points and determines the minimum cut. This algorithm is well known in the art so the details of this method are not presented here. All the areas that show minimum cuts are flagged as suspicious points. The circuit extractor operator or layout designer can then further investigate these suspicious points and correct any errors.

FIG. 4 shows the node network of FIG. 3 using the ratio of the total used current capacity of each edge versus the current capacity of the edge as a measure for the network flow analysis algorithms instead of just edge widths. For the node pairs Bn, Cn; Cn, Dn and Dn, En, the current capacity ratio is at maximum (x2/x2). For node pairs An, Bn and En, Fn, current capacity ratio is not at its maximum, since the ratio x2/x1 is less then 1, x1 being greater than x2. In examining FIG. 4, it can be seen that locations having minimum cut will define the maximum flow of the network when using the ratio of the used current capacity of each edge relative to the current capacity of the edge as a measure.

Figure 5:
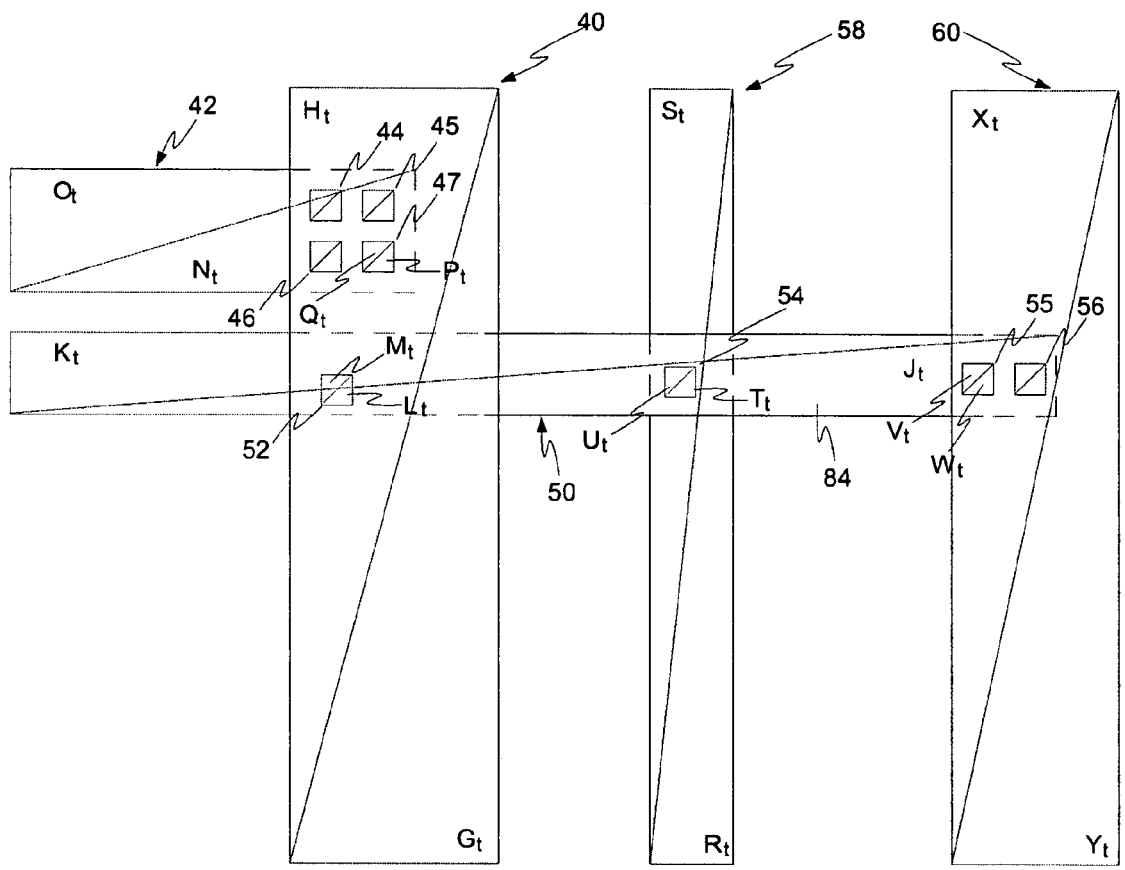
FIG. 5 shows the tessellation of FIG. 1b into triangles.

FIG. 5 shows the tessellation of the example shown in FIG. 1b where a bus 40 is incorrectly shorted to a net 50 through an erroneous via 52. Via 52 is shown as a via since the imaging software would identify dust or other such particles as a conductive connection, a via, rather then a large bus structure. The first signal bus 40 is divided into triangles Gt and Ht. The second signal bus 42 is divided into triangles Nt and Ot. The first, second, third and fourth vias 44, 45, 46, 47 are each divided into triangles Pt and Qt. The first net 50 is divided into triangles Jt and Kt. The second net 58 is divided into triangles Rt and St. The fifth via 54 is divided into triangles Tt and Ut. The third signal bus 60 is divided into triangles Xt and Yt. The sixth and seventh vias 55, 56 are each divided into triangles Vt and Wt. The eighth via 52 is divided into triangles Lt and Mt.

Figure 6:
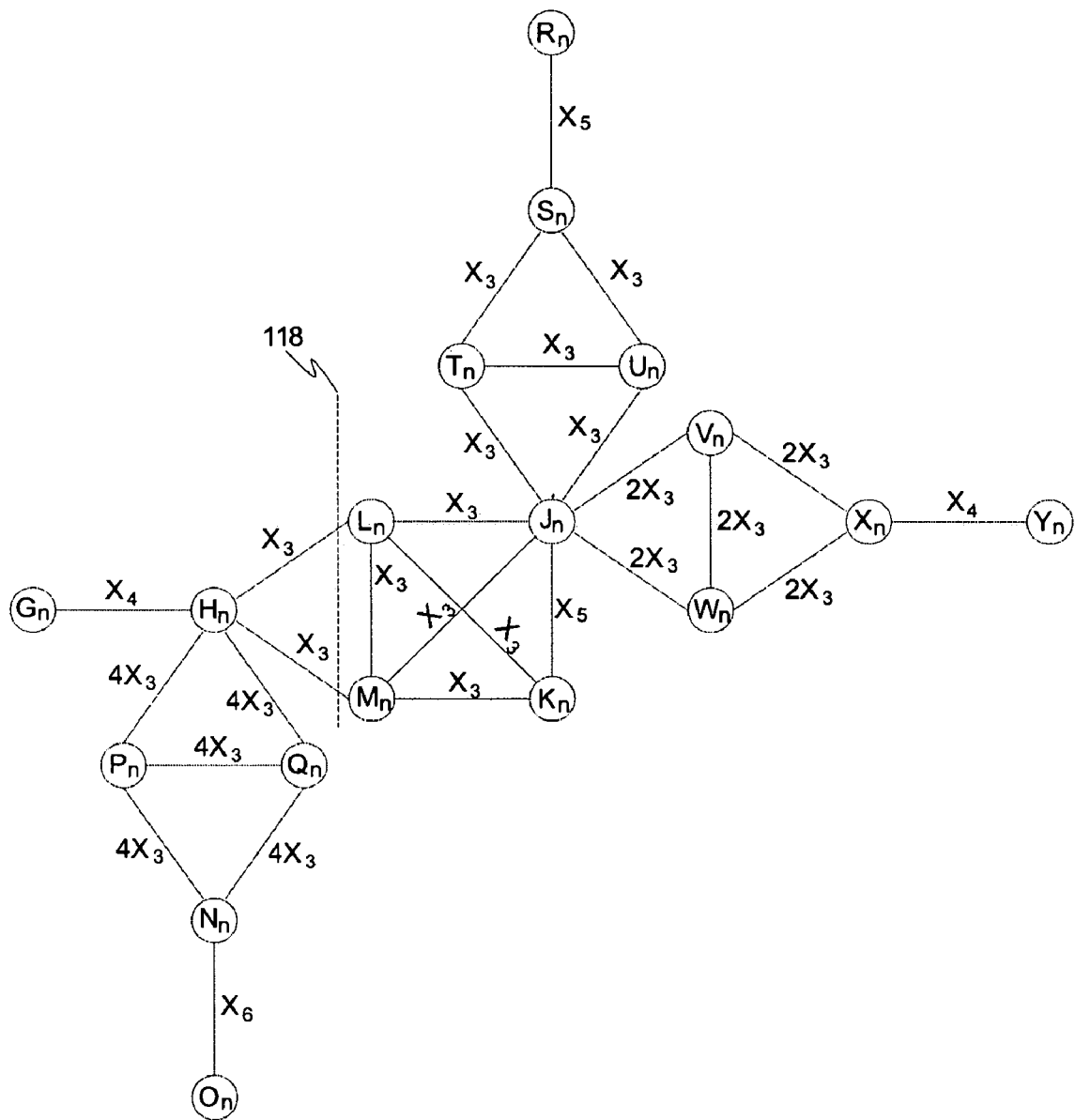
FIG. 6 shows the node network corresponding to the tessellated network of FIG. 5.

The next step is to translate the tessellated network into a node network. FIG. 6 shows the node network of FIG. 5. The connection of the nodes is arranged according to the triangles of FIG. 5. Triangle Gt is connected only to triangle Ht, therefore node Gn has a single connection. Triangle Ht is connected to triangle Gt but also to triangles Lt, Mt, Pt and Qt, therefore node Hn is connected to nodes Gn, Ln, Mn, Pn and Qn. Since the vias 44, 45, 46, 47 connecting the first signal bus 40 with the second signal bus 42 are all adjacent to the same triangles, they can be seen in parallel with each other, thus only two nodes, Pn and Qn, instead of eight, are required to represent the eight triangles of these vias. Triangle Nt is adjacent to triangles Pt and Qt, therefore node Nn is connected to both nodes Pn and Qn. Triangle Ot has only one connection and this is to triangle Nt, therefore node On is only connected to node Nn. Triangles Lt and Mt are connected to triangles Ht, Jt, Kt and to each other, therefore nodes Ln and Mn are connected to nodes Hn, Jn, Kn and to each other. Triangle Jt is also adjacent to triangles Tt and Ut, therefore node Jn is also connected to both nodes Tn and Un. Triangles Tt and Ut are also adjacent to triangle St, therefore nodes Tn and Un are both connected to node Sn. Triangle Rt has only one connection and this is to triangle St, therefore node Rn is only connected to node Sn. Lastly, triangle Jt is also connected to triangles Vt and Wt, therefore node Jn is also connected to both nodes Vn and Wn. Since the sixth and seventh vias 55, 56 are adjacent to the same triangles, they can be seen in parallel with each other, thus only two nodes Vn and Wn are required to represent the four triangles of these vias. Triangles Vt and Wt are also adjacent to triangle Xt, therefore nodes Vn and Wn are both connected to node X. Triangle Yt has only one connection and this is to triangle Xt, therefore node Yn is only connected to node Xn.

The width between nodes Gn and Hn is given by x4. The maximum current capacity between the bus 40 and the eighth via 52 is the smallest of the current capacities of the bus 40 or the via 52 in the area of connection or adjacency. As via 52 clearly handles less current than the first signal bus 40, so the width of the eighth via 52 is given by x3 where x3<x4. As a result, the width between nodes Hn, Ln and Mn is given by x3. Since the first net 50 also handles more current than the eighth via 52, its width is larger. The width, therefore, between node pairs Jn, Ln; Jn, Mn; Kn, Ln and Kn, Mn is also given by x3. The current capacity of the first net 50 is greater than the eighth via 52, but less than the first signal bus 40. Its width is given by x5 where x3<x5<x4. The width between nodes Jn and Kn is given by x5. Assuming that all the vias of this example have standard sizes, the width between node pairs Hn, Pn and Hn, Qn is 4x3 since the first, second, third and fourth vias 44, 45, 46, 47 are in parallel they can support four times the current as a single via having a width of x3. The width between nodes On and Nn is given by x6 where x3<x5<x6<x4. The maximum current capacity between node Nn and nodes Pn and Qn is the smallest current capacity of either the second net 42 or the four vias connecting the first signal bus 40 with the second signal bus 42 at the area of connection. Assuming that x6 has a greater width than 4x3, the maximum current capacity between node Nn and nodes Pn and Qn is 4x3. The maximum current capacity between node Jn and nodes Tn and Un is x3 since the current capacity of the fifth via 54 is smaller than the second net 58. Assuming that the first and second nets 50, 58 have the same width, then the maximum current capacity between node Sn and nodes Tn and Un is also x3. The width between nodes Sn and Rn is x5, similar to the width between nodes Jn and Kn. The maximum current capacity between node Jn and nodes Vn and Wn is the smallest current capacity of either first net 50 or the sixth and seventh vias 55, 56 at the area of connection. Since these vias are in parallel, they can support twice as much current as a single via having a width of x3, therefore the current capacity that nodes Vn and Wn is 2x3. Assuming that x5 has a greater width than 2x3, the maximum current capacity between node Jn and nodes Vn and Wn is 2x3. Assuming that the width of third signal bus 60 is the same as the first signal bus 40, then the maximum current capacity between node Xn and nodes Vn and Wn is also 2x3. The width between nodes Xn and Yn is x4.

As discussed earlier, following the creation of the node network of FIG. 6, network flow analysis algorithms are run on this node network to determine locations of minimum cut. The minimum cut of the present example is shown by the dotted line 118. This minimum cut separates the first signal bus 40 from erroneous via 52 and the first net 50.

Figure 7:
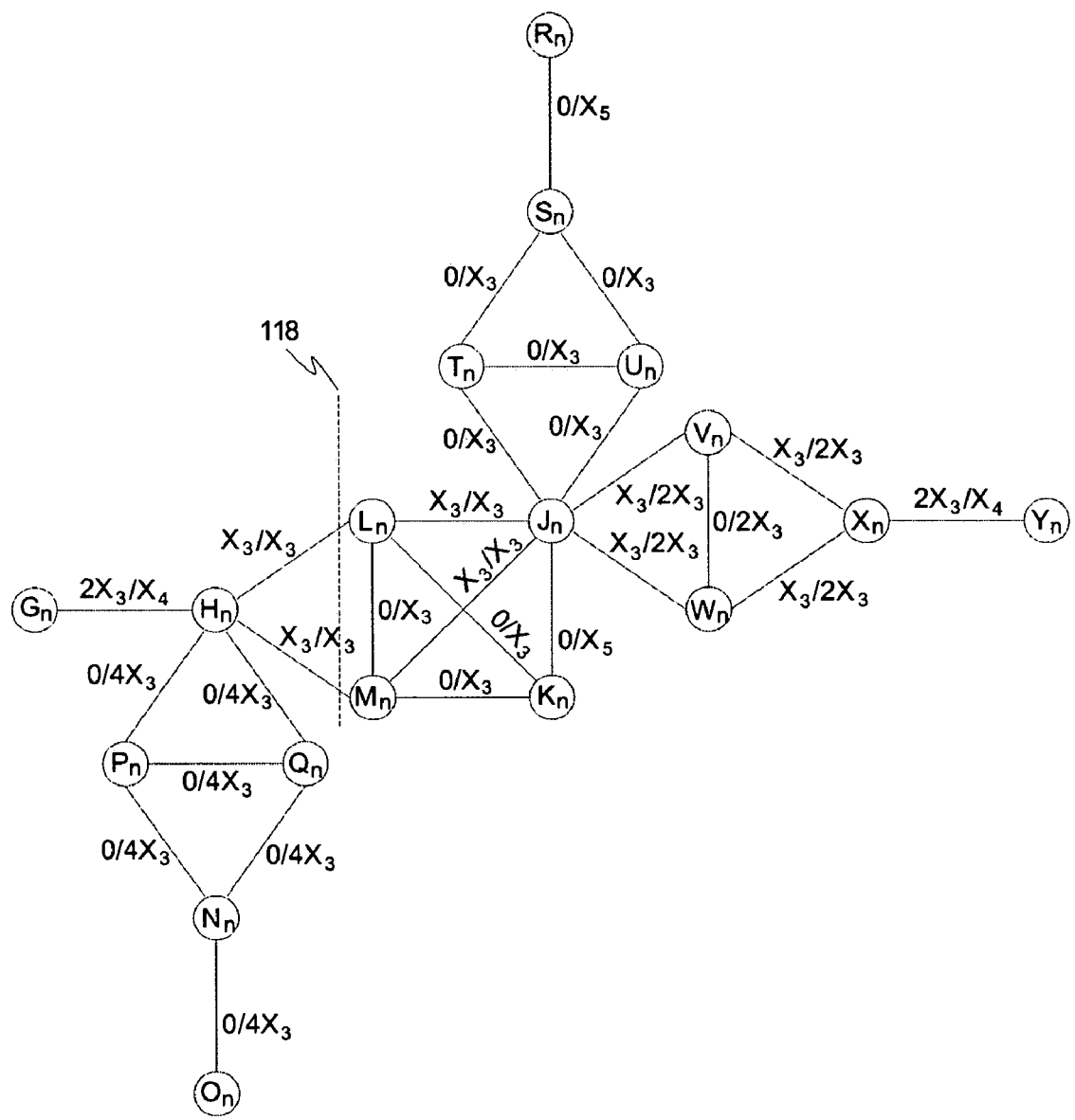
FIG. 7 shows the same node network of FIG. 5 showing the total used current capacity of each edge versus the current capacity of each edge.

FIG. 7 shows the node network of FIG. 6 using the ratio of the total used current capacity of each edge versus the current capacity of the edge as a measure for the network flow analysis algorithms instead of edge widths, similarly to the previous example shown in FIG. 4. Nodes Gn and Yn are part of different signal busses, but because of an erroneous via 52, a short circuit situation is created. For the node pairs Gn, Hn and Xn, Yn the ratio of the total used current capacity of the edges between triangles Gt, Ht and Xt, Yt versus the current capacity of these edges is given by 2x3/x4. This represents the total used current capacity versus the current capacity of the edge. There exists two minimum paths between Gn and Yn. There is the Gn-Hn-Ln-Jn-Wn-Xn-Yn path and the Gn-Hn-Mn-Jn-Vn-Xn-Yn path. The Gn-Hn edge and the Xn-Yn edge are used for both paths, so the total used current capacity is 2x3. Looking at nodes Pn, Qn, Nn and On, they are electrically connected to node Hn and the first signal bus 40, but as shown in FIGS. 6 and 7, they are not part of the flow path between nodes Gn and Yn. During the execution of the Ford-Fulkerson network flow analysis algorithm, only the flow paths between two predetermined points are analyzed. In this case, the short circuit occurs between nodes Gn and Yn so the current capacities between nodes Hn, Pn, On, Nn and On is not used. The same situation applies for nodes Tn, Un, Sn and Rn. Even though the second net 58 is electrically connected to node Xn and the third signal bus 60, nodes Tn, Un, Sn and Rn are not in the flow path between nodes Gn and Yn as seen in FIGS. 6 and 7. The two node pairs Ln, Mn and Vn, Wn have a used current capacity of their edges as zero since the triangles represented by these nodes are in parallel, thus the flow path between the triangles of the same via is redundant and unnecessary. The node pair of Jn and Kn has a current capacity ratio of x3/x5. The node pair of Vn and Wn has a current capacity ratio of 0/2x3. It is obvious that the first signal bus 40, the first net 50 and the third signal bus 60 do not use their maximum current capacity when the erroneous via 52 shorts them all together. The maximum flow therefore between nodes Gn and Yn is given by the minimum edge widths of adjacent nodes. In this example, the current capacity ratio between nodes Hn, Ln and Hn, Mn is x3/x3. This represents the maximum ratio of this network diagram and thus x3 is the maximum current that the eighth and erroneous via 52 can sustain and as a result, it is the maximum current that this example network can sustain.

The minimum cut line 118 of FIG. 7 shows the location where there exist edges that define the maximum flow of the network.

Figure 8A:
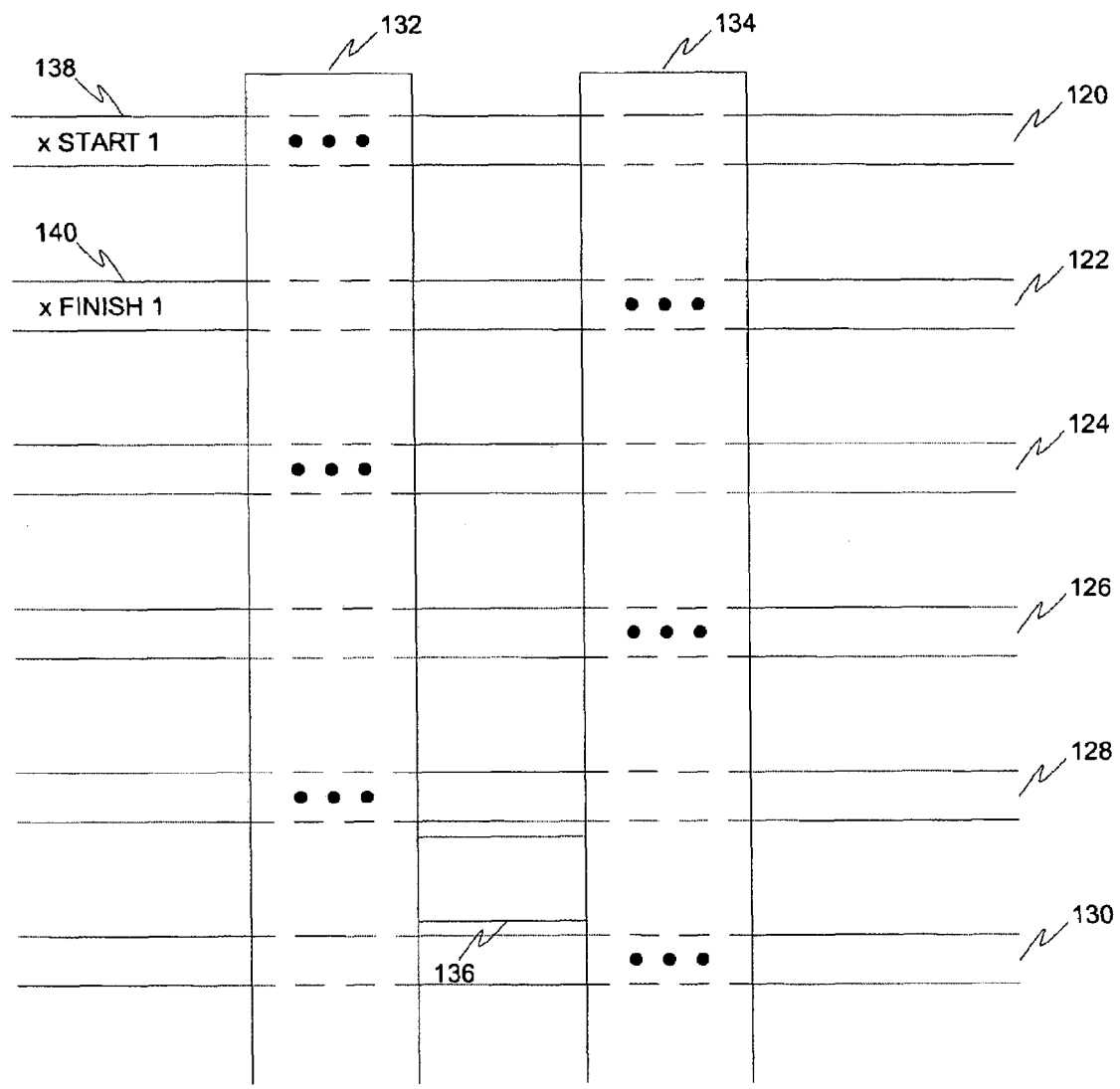
FIG. 8a shows an example where a net has a higher current density than the erroneous polygon.

In the previous examples, the location of the short was found by investigating areas of high current density in comparison to adjacent nodes. These areas also had the lowest current flow capacity. FIG. 8a shows an example of a short circuit where the short circuit does not have the lowest current capacity. In this example, the start point 138 is marked on net 120. The finish point 140 is marked on net 122. Net 132 electrically connects nets 120, 124 and 128. Net 134 electrically connects nets 122, 126, and 130. Nets 132 and 134 represent two unique signals. Erroneous polygon 136, however, shorts nets 132 and 134 together so they become electrically connected. If a network flow analysis algorithm is run on this example using the start and finish points as indicated, the areas showing the highest current density in comparison to adjacent nodes will be nets 120 and 122. Erroneous polygon 136 has a higher current capacity than either net 120 or 122 so the network flow analysis will fail to show the true location of the short.

Figure 8B:
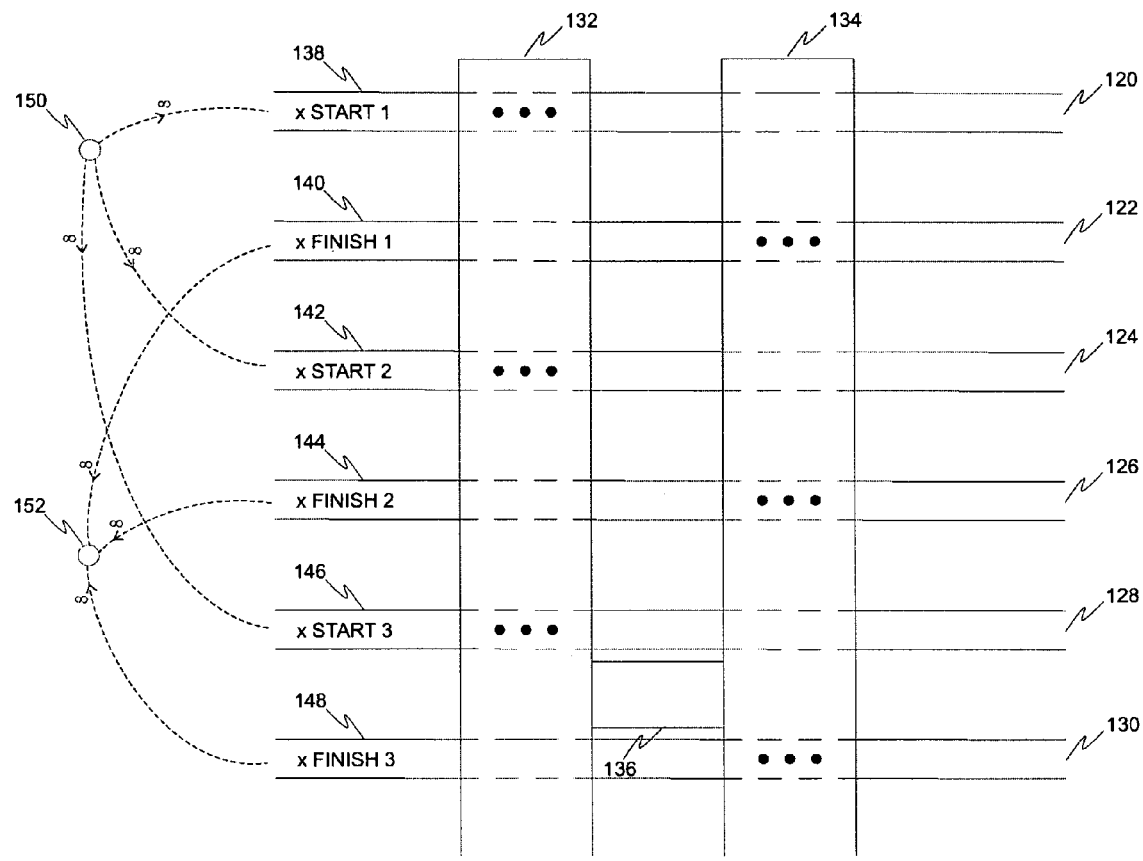
Figure 8C:
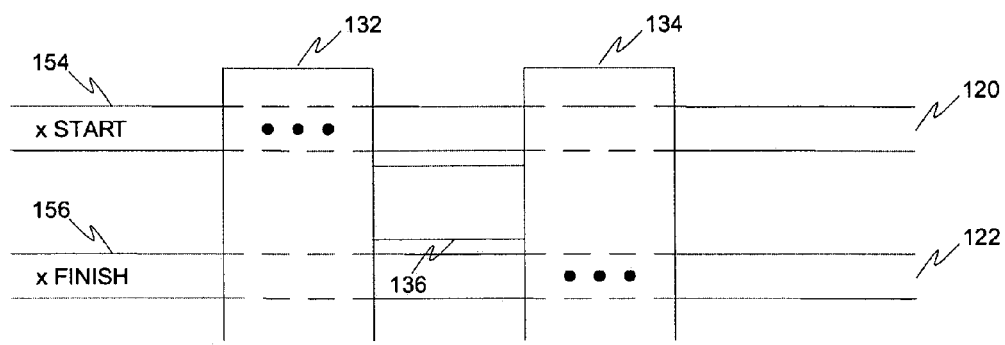
FIG. 8c shows an equivalent layout after the network flow analysis algorithm is run on FIG. 8b.

In order to resolve this problem, multiple start and finish points are selected. FIG. 8b shows three start points and three finish points. In addition to start point 138 on net 120, a second start point 142 on net 124 and a third start point 146 on net 128 are added. Likewise, in addition to finish point 140 on net 122, a second finish point 144 on net 126 and a third finish point on net 130 are also added. When the network flow analysis algorithm runs this example, it creates a virtual start point 150 and a virtual finish point 152. Virtual start point 150 is connected to each of the three start points 138, 142 and 146. Because of its virtual nature, the current capacity between virtual start point 150 and each of the start points 138, 142 and 146 is given by infinity. The same principle applies with virtual finish point 152 such that the current capacity between virtual finish point 152 and each of the finish points 140, 144, and 148 is also infinity. The network flow analysis algorithm is run between virtual points 150 and 152. Because each of the virtual points is connected to an actual start and finish point, there exists three paths between virtual start point 150 and virtual finish point 152. The first path includes start point 138 and finish point 140. The second path includes start point 142 and finish point 144. The third path includes start point 146 and finish point 148. Although the start points are located on different nets, the nets are electrically connected together. The same applies for the finish points. As a result, all three paths are in parallel. The equivalent result of the three parallel paths is shown in FIG. 8c. Net 154 is a result of summing nets 120, 124 and 128 from FIG. 8b since they are in parallel. Net 156 is a result of summing nets 122, 126 and 130. The width of nets 154 and 156 is proportional to the number of start/finish point pairs. There are three pairs, therefore net 154 has a current capacity three times larger than net 120. The resultant net 154 now has a current capacity larger than the erroneous polygon 136. It is clear that running the network flow analysis algorithm on FIG. 8c would result in the true location of the short since erroneous polygon 136 will have the highest current density and lowest current flow capacity. Depending on the nature of the erroneous polygon, a plurality of start and finish points will be required to determine the location of this erroneous polygon.

Figure 9:
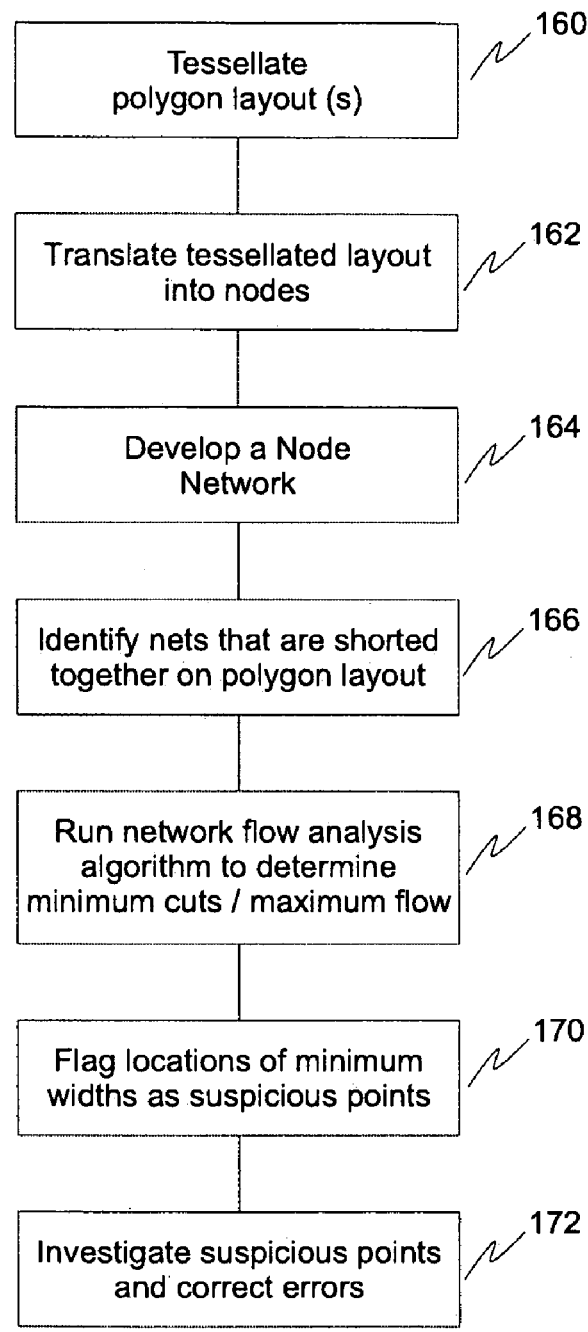
FIG. 9 shows a flowchart of the process steps of the present invention.

In a flowchart format, FIG. 9 summarizes the steps involved to determine the locations of shorted nets in accordance with the present invention. The initial step 160 is to tessellate, using shapes such as triangles or trapezoids, the polygon layout or layouts if there is more than one conductive layer, which is usually the case. Step 162 involves translating the shapes into nodes from which a node network is developed in step 164. As mentioned earlier, the location and connection of the nodes correspond to the triangles and the adjacency of the triangles such that it is representative of current flow paths. Step 166 is to determine which nets are erroneously connected together. This information usually comes from the engineer who is working on the circuit extraction and realizes a short circuit between two points. The operator preparing the polygon representation from the images of the IC layout may also detect a short circuit between two points. Step 168 includes running a network flow analysis algorithm that will determine the locations of minimum cuts. The network flow analysis algorithms look at flow paths from one point to another. The next step 170 flags the locations of the minimum cuts as suspicious points or potential short locations. In step 172, the layout designer or layout extractor investigates the suspicious points and determines if they are actually shorted locations or proper connections. If the suspicious points are recognized as shorts, then it is simply a matter of correcting the polygon layout using techniques known in the art.

Figure 10:
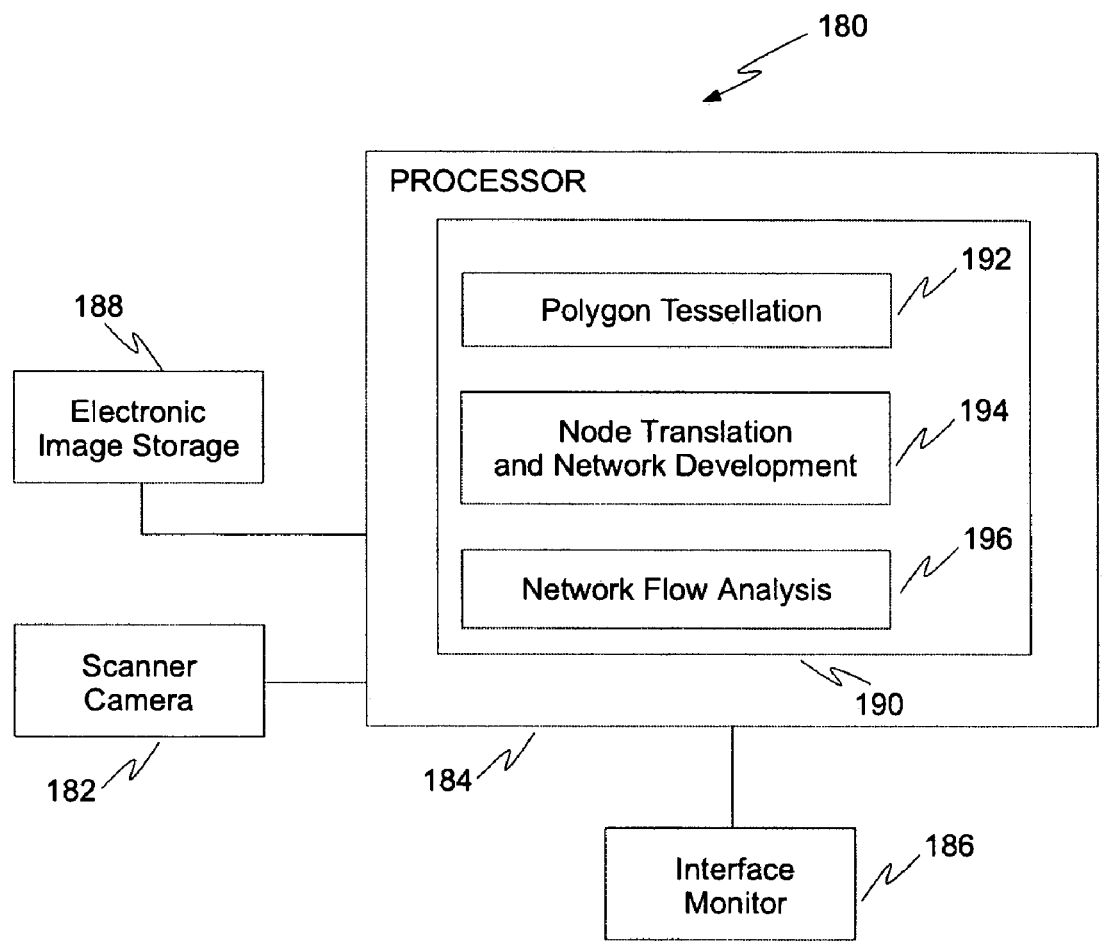
FIG. 10 shows a schematic diagram of the apparatus in accordance with the present invention.

The method of locating short circuit faults in an integrated circuit in accordance with the present invention can also be described in conjunction with the apparatus 180 schematically illustrated in FIG. 10. The integrated circuit must be de-capped to expose the top layer of the circuit in question, which is normally a metal layer. The exposed layer is scanned under high magnification using a scanner 182 based on film, a digital camera, a scanning electron microscope (SEM) or an X-ray camera under the control of an operator using a processor 184 through an interface/monitor 186. It is preferred to use a SEM or some such device in order to attain the high magnification required, as well as to produce an electronic image. Normally, the entire surface of the integrated circuit would have to be scanned. This is usually accomplished by producing a series of overlapping images that are stitched together electronically to form a single electronic mosaic image of the entire layer. Next, the electronic image of the stored image representing the layer of the IC layout is transformed into a vector representation and stored in memory 188. Once the entire layer or the desired portion of layer has been scanned, it is determined whether there is a further layer to be scanned. If that is the case, the previously scanned layer is removed to expose the next layer of the integrated circuit to be scanned. This process continues for all of the layers required to analyze the IC. Once all of the layers have been scanned and stored electronically in vector format in memory 188, the layers are aligned vertically and horizontally using the vector data of the layers. The layers are then overlaid in their proper sequence to form a three dimensional vector image of the IC, which may be viewed on interface/monitor 186. Each layer may be represented by a different color or cross-hatching to facilitate the viewing of the different layers by an operator, which in turn will allow the operator to readily recognize circuit elements such as transistors, gates and even more complex circuits.

Incorrectly connected polygons can occur at anytime during the process described above, such as during scanning or during alignment. To locate these shorts, a short circuit fault locator 190 is included in processor 184. The short circuit fault locator stores the algorithms that determine the location of the short. These algorithms are responsible for the three main processes that are in accordance with the present invention: polygon tessellation 192, node translation and network development 194 and network flow analysis

196. Polygon tessellation 192 involves a computational geometry algorithm that tessellates the polygons of the electronic image representation of the IC, which is stored in memory 188, into predetermined shapes. Node translation and network development translates the predetermined shapes into nodes and arranges the nodes into a nodal network representative of the tessellated network. The connections between each node represent the current capacity between adjacent nodes as described earlier. The network flow analysis 196 is an algorithm that is run on this nodal network between at least two nodes to locate areas of high current density. The operator identifies at least two nodes on nets that are electrically disconnected, but which are erroneously displayed on interface monitor 186 as connected. After this algorithm is run, it flags these areas of high current density as points of possible incorrectly connected polygons for further investigation.

As discussed above, the technique in accordance with the present invention allows a circuit analyst to pinpoint locations in the IC layouts where, what appears to be conductive connections, are erroneously in the IC layout. The IC layouts may be those created by a designer in the design of an IC or by an analyst while reverse engineering a circuit. These erroneous conductive connections would cause shorts between nets if they were converted to masks for the fabrication of an IC or would render it more difficult to identify components in the reverse engineered layout. The technique saves the designer and analyst enormous amounts of time, since entire layouts do not have to be searched in detail to find the errors due to incorrect net placement or an error in layout extraction.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of determining a location of possible incorrectly connected polygons in a polygon representation of an integrated circuit having at least one conductive layer comprising steps of:
   (a) tessellating the polygon representation into predetermined shapes;
   (b) translating the predetermined shapes into nodes;
   (c) developing a node network where the nodes are connected directly to one another as a representation of shapes having adjacent edges;
   (d) identifying a current capacity between connected nodes for the nodes in the node network;
   (e) selecting at least two nodes in the node network that are electrically connected to possible in correctly connected polygons;
   (f) running a network flow analysis algorithm between the at least two selected nodes to determine areas of high current density based on the current capacities between adjacent nodes in the node network; and
   (g) flagging the areas of high current density as points of the possible incorrectly connected polygons for further investigation.

2. The method as claimed in claim 1 wherein the step (d) includes determining a ratio of total used current capacity of each edge relative to the current capacity of said each edge for adjacent nodes, and the step (f) includes running the network flow analysis algorithm based on the ratios.

3. The method as claimed in claim 1 wherein the polygon representation includes one or more vias connecting adjacent conductive layers.

4. The method as claimed in claim 3 wherein the polygons in the polygon representation are signal buses.

5. The method as claimed in claim 1 wherein the network flow analysis algorithm is a Ford-Fulkerson algorithm.

6. The method as claimed in claim 1 wherein said predetermined shapes comprise triangles.

7. The method as claimed in claim 1 wherein said predetermined shapes comprise trapezoids.

8. The method as claimed in claim 1 wherein the current capacity is a function of width of signal buses and vias.

9. An apparatus for determining a location of possible incorrectly connected polygons in a polygon representation of an integrated circuit having at least one conductive layer comprising:
   means for tessellating the polygon representation into predetermined shapes;
   means for translating the predetermined shapes into nodes;
   means for developing a node network where the nodes are connected directly to one another as a representation of shapes having adjacent edges;
   means for identifying a current capacity between connected nodes for the nodes in the node network;
   means for selecting at least two nodes in the node network that are electrically connected to the possible connected polygons;
   means for running a network flow analysis algorithm between the at least two selected nodes to determine areas of high current density based on the current capacities between adjacent nodes in the node network; and
   means for flagging the areas of high current density as points of the possible incorrectly connected polygons for further investigation.

10. The apparatus as claimed in claim 9 wherein the means for identifying current capacity includes means for determining a ratio of total used current capacity of each edge relative to the current capacity of said each edge for adjacent nodes, and wherein the means for running a network flow analysis algorithm includes means for running the network flow analysis algorithm based on the ratios.

11. The apparatus as claimed in claim 9 wherein the polygon representation includes one or more vias connecting two or more conductive layers.

12. The apparatus as claimed in claim 11 wherein the polygons in the polygon representation are signal buses.

13. The apparatus as claimed in claim 9 wherein the network flow analysis algorithm is a Ford-Fulkerson algorithm.

14. The apparatus as claimed in claim 9 wherein said predetermined shapes comprise triangles.

15. The apparatus as claimed in claim 9 wherein said predetermined shapes comprise trapezoids.

16. The apparatus as claimed in claim 9 wherein the current capacity is a function of width of signal buses and vias.

* * * * *

UNITED STATES PATENT AND TRADEMARK OFFICE
CERTIFICATE OF CORRECTION

| | | |
|---|---|---|
| PATENT NO. | : 7,207,018 B2 | Page 1 of 1 |
| APPLICATION NO. | : 10/910624 | |
| DATED | : April 17, 2007 | |
| INVENTOR(S) | : Vyacheslav L. Zavadsky et al. | |

It is certified that error appears in the above-identified patent and that said Letters Patent is hereby corrected as shown below:

Column 9
Claim 1, line 57, before "possible" insert --the--.
Claim 1, line 57, "in correctly" should be --incorrectly--.

Column 10
Claim 9, line 32; after "possible" insert --incorrectly--.

Signed and Sealed this

Twenty-fourth Day of July, 2007

JON W. DUDAS
*Director of the United States Patent and Trademark Office*